US008013319B2

(12) United States Patent
Chang

(10) Patent No.: US 8,013,319 B2

(45) Date of Patent: Sep. 6, 2011

(54) PHASE CHANGE MEMORY DEVICE HAVING A BENT HEATER AND METHOD FOR MANUFACTURING THE SAME

(75) Inventor: Heon Yong Chang, Gyeonggi-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 604 days.

(21) Appl. No.: 12/173,912

(22) Filed: Jul. 16, 2008

(65) Prior Publication Data

US 2009/0267044 A1 Oct. 29, 2009

(30) Foreign Application Priority Data

Apr. 28, 2008 (KR) ........................ 10-2008-0039513

(51) Int. Cl.
*H01L 29/04* (2006.01)

(52) U.S. Cl. .. 257/3; 257/2; 257/4; 257/5; 257/E45.002; 365/163

(58) Field of Classification Search .................. 257/2–5, 257/E45.002; 365/163
See application file for complete search history.

(56) References Cited

U.S. PATENT DOCUMENTS

2004/0051094 A1* 3/2004 Ooishi .............................. 257/5
2005/0152208 A1* 7/2005 Bez et al. ...................... 365/232

FOREIGN PATENT DOCUMENTS

KR 1020060001056 A 1/2006
KR 1020060094424 A 8/2006
KR 10-0795908 B1 1/2008
KR 1020090006628 A 1/2009

* cited by examiner

*Primary Examiner* — Evan Pert
*Assistant Examiner* — Selim Ahmed
(74) *Attorney, Agent, or Firm* — Ladas & Parry LLP

(57) ABSTRACT

A phase change memory device includes heaters which are formed in their respective memory cells and vertically positioned stack patterns having phase change layers and top electrodes which are formed to come into contact with the heaters. The heaters have horizontal cross-sectional bent shapes which can have any number of shapes such as a shape similar to that of a boomerang. The horizontal cross-sectional bent shapes of the heaters are for minimizing the contact area between the heaters and the phase change layer so that programming currents can be reduced or minimized.

14 Claims, 13 Drawing Sheets

PHASE CHANGE MEMORY DEVICE HAVING A BENT HEATER AND METHOD FOR MANUFACTURING THE SAME

CROSS-REFERENCE TO RELATED APPLICATIONS

The present application claims priority to Korean patent application number 10-2008-0039513 filed on Apr. 28, 2008, which is incorporated herein by reference in its entirety.

BACKGROUND OF THE INVENTION

The present invention relates to a phase change memory device and a method for manufacturing the same, and more particularly, to a phase change memory device that is designed to reduce the contact area between a heater and a phase change layer and a method for manufacturing the same.

In general, memory devices are generally divided into volatile RAMs (random access memory) which loses inputted information when power is interrupted and into non-volatile ROMs (read-only memory) which can maintain the stored state of inputted information even when power is interrupted. As to volatile RAMs, DRAMs (dynamic RAM) and SRAMs (static RAM) are well known. As the non-volatile ROMs, flash memory device such as an EEPROMs (electrically erasable and programmable ROM) are also well known.

While the DRAMs are excellent memory devices, DRAMs require high charge storing capacity. Accordingly, for DRAMs the surface area of the electrodes must be increased, which makes it difficult to accomplish a high level of integration. Due to the fact that two gates are stacked on top of each other for flash memory devices, high operation voltages are required when compared to a power supply voltage. According for flash memory devices, a separate booster circuit is needed to generate a voltage necessary for write and delete operations, which makes it also difficult to accomplish a high level of integration.

Therefore, much interest has been expended in the development of alternative novel memory device. These alternate novel memory devices are preferred to have simple configurations and preferred to be capable of accomplishing a high level of integration while retaining many of the desirable characteristics of non-volatile memory devices. As one example, an alternate novel memory device is the phase change memory device.

Phase change memory devices function on the basis of the fact that a phase change can occur in a phase change layer interposed between a bottom electrode and a top electrode. This phase change is associated with a reversible transformation between a crystalline state and an amorphous state brought about by a current flowing between the bottom electrode and the top electrode. Accordingly, information can be stored in a memory cell of a phase change memory device by measuring the resistances because the specific resistances between the crystalline state and the amorphous state are different.

Phase change memory devices often incorporate a chalcogenide layer composed of such material such as germanium (Ge), stibium (Sb), sulfur (S), selenium (Se) and tellurium (Te) as a phase change layer. As a current is applied, the phase change layer undergoes a phase change transition induced by heat, that is, Joule heat, between the amorphous state and the crystalline state. Accordingly, in the phase change memory device the specific resistance of the phase change layer in the amorphous state is often times higher than the specific resistance of the phase change layer in the crystalline state. In a read mode, by sensing the current flowing through the phase change layer, it can be determined whether or not the information stored in a phase change cell has a logic value corresponding to a '1' or a '0'.

In the phase change memory devices in order to ensure that phase changes occur in a relatively stable and consistent manner, programming currents should be minimized or at least decreased. Thus, in the conventional art, in order to decrease programming current, much interest has been associated with regards to reducing the contact area between the heaters serving as bottom electrodes and the phase change layer. That is, as the contact area between the heaters and the phase change layer is reduced, the current density at these contact surfaces of the heaters and the phase change layer increases. Accordingly, the current required for driving the phase change operations of the phase change layer can be decreased.

For example, in the conventional art, after defining contact holes to have a small diameter of less than 100 nm, the corresponding formed heaters from these diminutive contact holes can also have a diminutive size. Then, a phase change layer is formed in contact with the open upper ends of the heaters.

However using conventional fabrication techniques to form these diminutive heaters having diameters equal to or less than 100 nm, a problem often arises in that it becomes increasingly more difficult in fabricating sufficiently uniform sized heaters in these memory cell array. As a result, the distribution of the programming current required to drive the phase change operations of the phase change layers of associated with these diminutive heaters widens to unacceptable levels.

Therefore, using conventional fabrication techniques, the size of these diminutive heaters cannot be made sufficiently uniform by simply decreasing the size of the heaters because the resultant distribution of programming currents becomes unacceptably wide. Accordingly, since it is difficult to achieve a narrow distribution of programming current and to achieve a decrease in the programming current, a novel method is needed.

SUMMARY OF THE INVENTION

Embodiments of the present invention are directed to a phase change memory device that can reduce the contact area between a heater and a phase change layer, and are directed to an associated method for manufacturing the same.

Embodiments of the present invention are also directed to a phase change memory device that can realize a reduction in the contact area between a heater and a phase change layer. Thereby promising to decrease the associated programming currents.

Embodiments of the present invention are also directed to a phase change memory device that can realize a more uniform distribution of programming currents, along with a method for manufacturing the same.

The phase change memory device includes heaters which are formed in respective cells and stack patterns of a phase change layer and top electrodes which are formed to come into contact with the heaters arranged in a vertical direction, wherein the heaters have a horizontal cross-sectional bent shape such as that similar to a boomerang.

The heaters having the horizontal cross-sectional bent shape of a boomerang can be bent and rounded at middle portions thereof.

The heaters having the horizontal cross-sectional bent shape similar to a boomerang are formed in such a manner that they can constitute four corners of a quadrangle which is formed by four adjacent memory cells facing each other.

The heaters having the horizontal cross-sectional bent shape of a boomerang, that are formed in the adjacent four cells can be arranged in a matrix pattern or a zigzag pattern in one direction along the device.

The phase change memory device comprises a silicon substrate having a plurality of active regions that extend along a first direction and are arranged at substantially regular intervals along a second direction perpendicular to the first direction; a plurality of cell switching elements vertically formed in the active regions; heaters vertically formed on the respective cell switching elements and having the horizontal cross-sectional bent shape of a boomerang; stack patterns of a phase change layer and top electrodes vertically formed in the shape of a vertical line and come into contact with respective heaters; a plurality of top electrode contacts vertically formed on the stack patterns; bit lines horizontally formed to be connected with the top electrode contacts arranged in the second direction; and word lines horizontally formed over the bit lines and the word lines extend along the first direction perpendicular to the bit lines and are connected with the silicon substrate.

The phase change memory device further comprises an N+ base layer formed in surfaces of the active regions.

The cell switching elements comprise vertical PN diodes.

The heaters having the horizontal cross-sectional bent shape of a boomerang are bent or rounded at middle portions thereof.

The heaters having the horizontal cross-sectional bent shape of a boomerang can be formed in a manner such that they constitute four corners of a quadrangle formed by four adjacent memory cells facing one another.

The heaters having the horizontal cross-sectional bent shape of a boomerang are formed in the four adjacent memory cells, can be arranged in a matrix pattern or a zigzag pattern on the substrate along one direction.

A method for manufacturing a phase change memory device includes the steps of vertically forming heaters in respective cells, and vertically forming stack patterns of a phase change layer and top electrodes on the heaters, wherein the heaters are formed to have the horizontal cross-sectional bent shape of a boomerang.

The heaters having the horizontal cross-sectional bent shape of a boomerang are formed to be bent or rounded at middle portions thereof.

The heaters having the horizontal cross-sectional shape of a boomerang can be formed in such a way as they constitute four corners of a quadrangle which is formed by four adjacent memory cells facing one another.

The heaters having the horizontal cross-sectional bent shape of a boomerang can be formed by four adjacent memory cells in a matrix shape pattern or a zigzag shaped pattern.

The method for manufacturing a phase change memory device comprises the steps of vertically forming a first insulation layer on a silicon substrate having a plurality of active regions that extend along a first direction and are arranged at substantially regular intervals along a second direction perpendicular to the first direction; forming vertically cell switching elements in the first insulation layer in the active regions; forming vertically a second insulation layer on the first insulation layer including the cell switching elements; etching selectively the second insulation layer to define holes that simultaneously expose portions of the cell switching elements of four adjacent memory cells; forming vertically a heater material layer on sidewalls of the holes; filling vertically a third insulation layer in the holes that are formed with the heater material layer on the sidewalls thereof; etching selective portions of the heater material layer and the second and third insulation layers to form heaters in the respective four adjacent memory cells such that each heater has a horizontal cross-sectional bent shape of a boomerang; filling vertically a fourth insulation layer in spaces that are formed by removing selected portions of the heater material layer and the second and third insulation layers; forming vertically stack patterns of a phase change layer and top electrodes such that the stack patterns come into contact with the heaters; forming vertically top electrode contacts on the stack patterns of respective cells; forming horizontally bit lines connected to the top electrode contacts such that the bit lines are arranged in the second direction; and forming horizontally word lines over the bit lines such that the word lines extend along the first direction perpendicular to the bit lines and the word lines are connected with the active regions of the silicon substrate.

Before the step of forming the first insulation layer, the method may further comprise the step of forming an N+ base layer in surfaces of the active regions.

The cell switching elements are formed as vertical PN diodes.

The holes may be defined to have a width of 100~500 nm in the first direction and the second direction. The holes may have asymmetric cross-section shape such as that of a rectangle in that the holes have different widths in the first direction and the second direction.

The holes may be defined to have a separation distances of 100~500 nm in the first direction and the second direction.

The holes may be defined such that the cell switching elements are exposed by a width of 10~100 nm in the first direction and the second direction.

The holes may be defined to have any number of different cross-sectional shapes such as those of a circle or of an ellipse.

The heaters having the horizontal cross-sectional bent shape of a boomerang can be formed to have a bent or rounded middle portions thereof.

The step of forming vertically the heaters having the sectional shape of a boomerang comprises the steps of forming vertically a mask pattern on the heater material layer and the second and third insulation layers such that the mask pattern covers corner portions of the heater material layer in the four cells which face one another; removing selectively portions of the heater material layer and the second and third insulation layers that are not covered by the mask pattern; and removing the mask pattern.

The mask pattern is subsequently formed to have a plurality of holes having a width of 100~500 nm in the first direction and the second direction in which the holes have a separation distance of 10~100 nm along the first direction and the second direction.

The mask pattern can be subsequently formed to have a plurality of holes having an overlap width of 10~100 nm in the first direction and the second direction with respect to the holes in which the heater material layer and the third insulation layer are formed, or to have different overlap widths in the first direction and the second direction with respect to the holes in which the heater material layer and the third insulation layer are formed.

The heaters having the horizontal cross-sectional bent shape of a boomerang can be formed using four adjacent memory cells such that they formed form of a matrix pattern or a zigzag pattern along one direction.

DESCRIPTION OF SPECIFIC EMBODIMENTS

Hereafter, specific embodiments of the present invention will be described with reference to the attached drawings.

Figure 1:
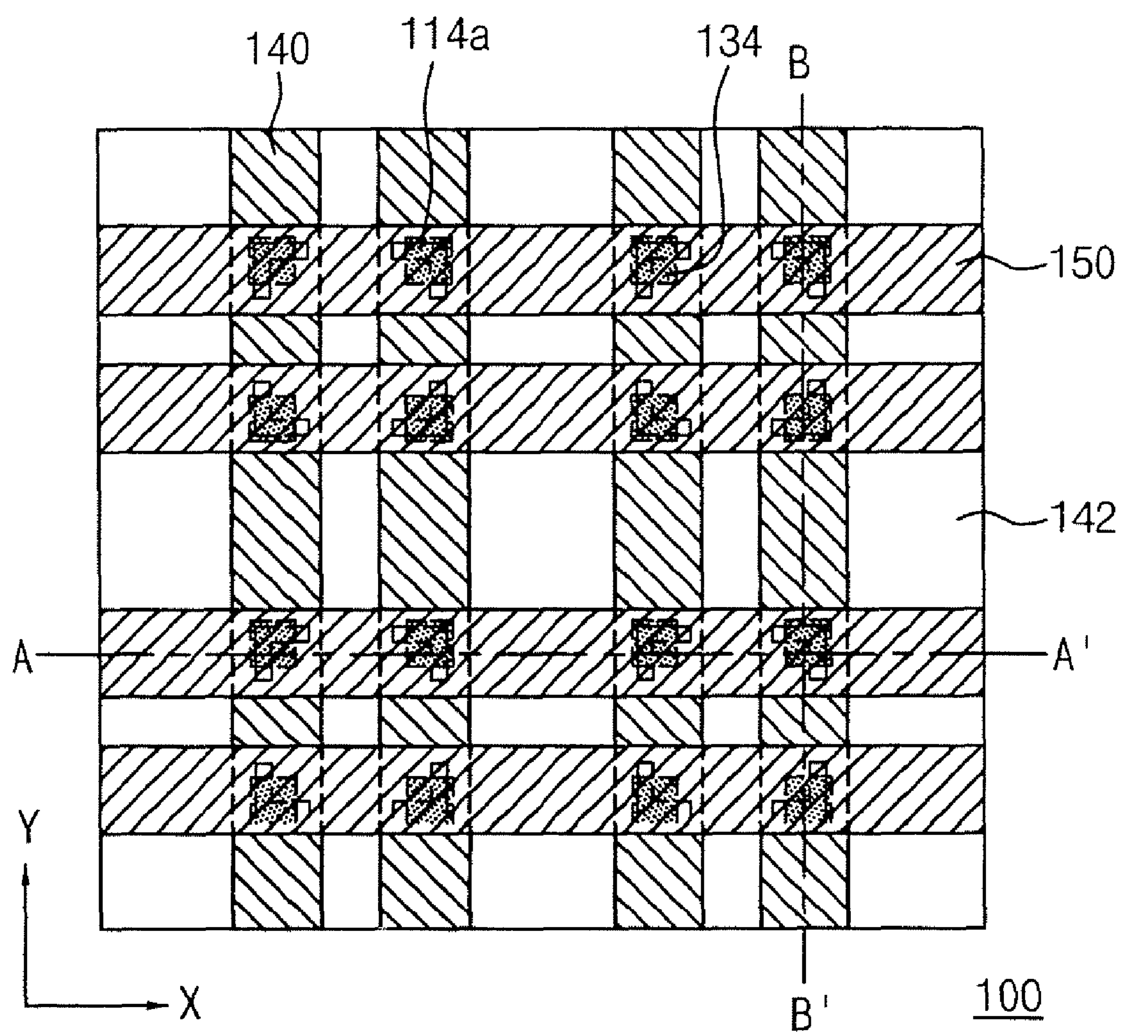
FIG. 1 is a plan view illustrating a phase change memory device in accordance with an embodiment of the present invention.
Figure 2A:
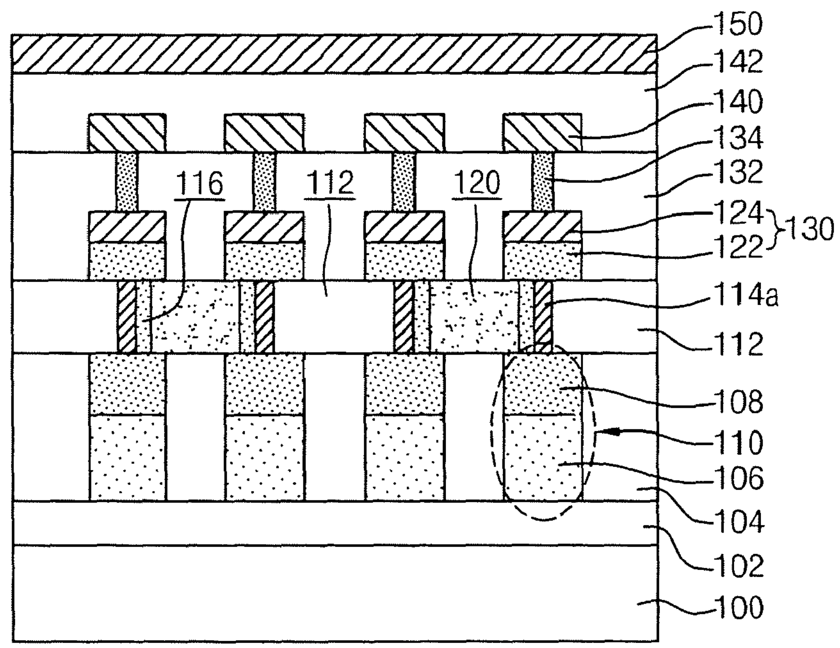
FIGS. 2A and 2B are cross-sectional views taken along the lines A-A' and B-B' of FIG. 1.
Figure 2B:
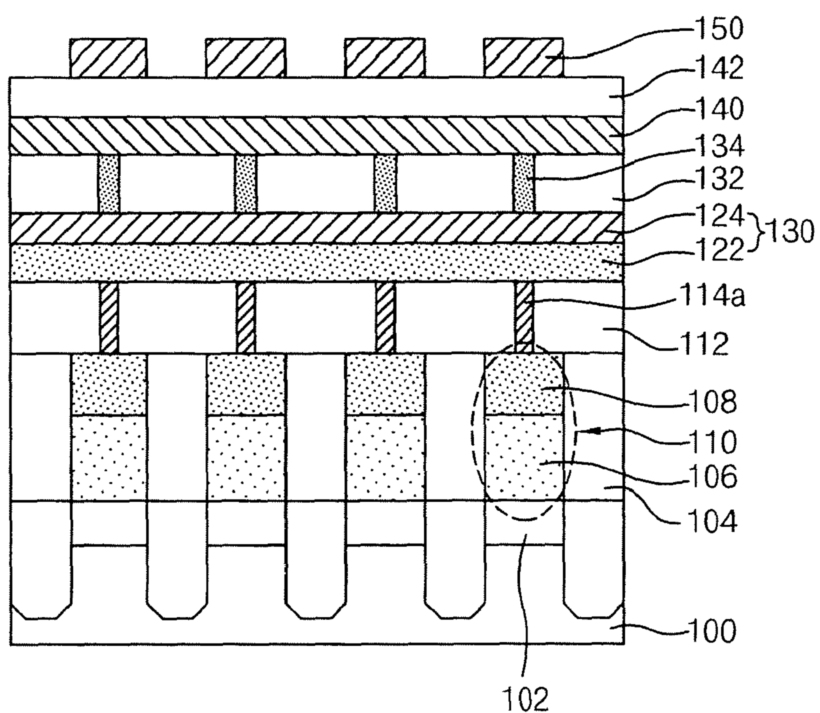

FIG. 1 is a plan view illustrating a phase change memory device in accordance with an embodiment of the present invention, FIG. 2A is a cross-sectional view taken along the line A-A' of FIG. 1, and FIG. 2B is a cross-sectional view taken along the line B-B' of FIG. 1.

Referring to these drawings, a silicon substrate 100 is prepared. The silicon substrate 100 has bar-type active regions distributed on the surface of the substrate 100 as that extend along a first direction X. An N+ base layer 102 is formed in the surfaces of the active regions. A plurality of vertical PN diodes 110 serving as cell switching elements are formed on the N+ base layer 102 of the silicon substrate 100. Each vertical PN diode 110 includes an N area 106 formed in the lower half thereof and a P area 108 formed in the upper half thereof. The N area 106 of the PN diode 110 is formed having a doping concentration lower than that of the N+ base layer 102 in order to prevent or minimize the occurrence of undesirable leakage current between the P area 108 and the N+ base layer 102.

Heaters 114*a* serving as bottom electrodes are then vertically formed on the respective vertical PN diodes 110. Stack patterns 130 of a phase change layer 122 and top electrodes 124 are then vertically formed on the heaters 114*a* in the shape of a line that extends along a third direction which is perpendicular to the plane defined by the first and second directions.

The heaters 114*a* are formed to have a horizontal cross-sectional bent shape, such as having a boomerang-like horizontal cross sectional bent shape. Four adjacent memory cells of the device can be arranged so that their respective heaters 114*a* form the four corners of a quadrangle. Accordingly, the phase change memory device of the present embodiment can result in the contact area between the heaters 114*a* and the phase change layer 122 to be substantially reduced. The heaters 114*a*, which are formed in the adjacent four cells and have the horizontal cross-sectional shape of a boomerang, can be arranged to form a matrix shape.

Top electrode contacts 134 are vertically formed on the stack patterns 130 of the phase change layer 122 and the top electrodes 124. Bit lines 140 are then vertically formed such that the bit lines 140 extend along the second direction Y in substantially the same manner as the stack patterns 130 and come into contact with the top electrode contacts 134 arranged in the second direction Y. The top electrode contacts 134 are then vertically formed in respective cells.

Word lines 150 are formed along a horizontal plane substantially in parallel to the plane defined by the bit lines 140. The word lines 150 are arranged along the first direction X perpendicular to the direction of the bit lines 140. While not shown in the drawings, the word lines 150 are connected with the N+ base layer 102 of the silicon substrate 100 by way of contact plugs.

Because heaters are formed to have horizontal cross-sectional bent shapes such as those resembling a boomerang, the resultant contact area between the heaters and their respective phase change layers can be substantially reduced. Whereupon, in the phase change memory device according to the present embodiment, the associated programming current can also be decreased due to the reduction of the contact area between the heaters and their respective phase change layers.

Moreover, in the present invention, the contact area between the heaters and the phase change layers can be controlled by the deposition thickness of the heaters. Accordingly, the deposition thickness of the heaters can be standardized in a uniform thickness that extends throughout the entire area of a silicon substrate. Consequently, the contact area between the heaters and the phase change layers can be made relatively uniform. Thus, because the distribution of programming current can be narrowed, the operation speed of the phase change memory device can be increased, and the reliability of using such a device thereof can be substantially improved.

In FIGS. 2A and 2B, here previous undiscussed reference numerals of 104 is used to designate a first insulation layer, 112 is used to designate a second insulation layer, 116 is used to designate a third insulation layer, 120 is used to designate a fourth insulation layer, 132 is used to designate a fifth insulation layer, and 142 is used to designate a sixth insulation layer.

FIGS. 3A through 3H are plan views illustrating the processes of a method for manufacturing a phase change memory device in accordance with another embodiment of the present invention, and FIGS. 4A through 4H are sectional views taken along the lines A-A' of FIGS. 3A through 3H.

Figure 3A:
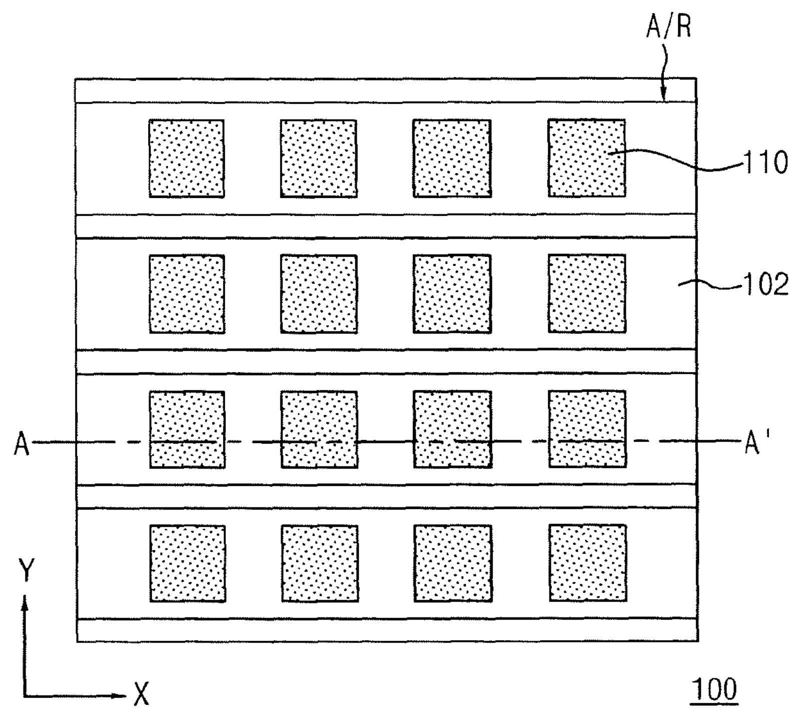
FIGS. 3A through 3H are plan views illustrating the processes of a method for manufacturing a phase change memory device in accordance with another embodiment of the present invention.
Figure 4A:
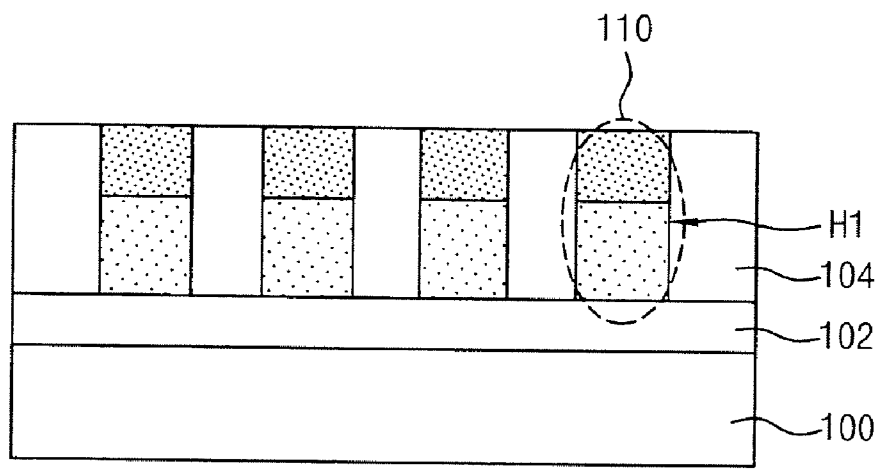
FIGS. 4A through 4H are cross-sectional views taken along the lines A-A' of FIGS. 3A through 3H.

Referring to FIGS. 3A and 4A, a silicon substrate 100 is prepared. The prepared silicon substrate 100 is shown including a plurality of active regions A/R that extend along a first direction X and that are arranged at substantially regular intervals along a second direction Y which is substantially perpendicular to the first direction X. An N+ base layer 102 is vertically formed on the surfaces of the active regions A/R. After forming a first insulation layer 104 on the silicon substrate 100 having the formed N+ base layer 102, the first insulation layer 104 is then etched to define a plurality of first holes H1 that delimit cell switching element forming areas. Then, after filling a conductive layer, for example, a silicon layer, in the first holes H1, by sequentially conducting N-type impurity ion implantation and P-type impurity ion implantation into the silicon layer filled in the first holes H1, vertical PN diodes 110 each composed of the stack of a lower N area and an upper P area are formed in the respective first holes H1. As described above, in order to prevent or minimize the occurrence of leakage current between the P area of the vertical PN diodes 110 and the N+ base layer 102, the N area of the vertical PN diodes 110 is formed having a doping concentration lower than that of the N+ base layer 102.

Figure 3B:
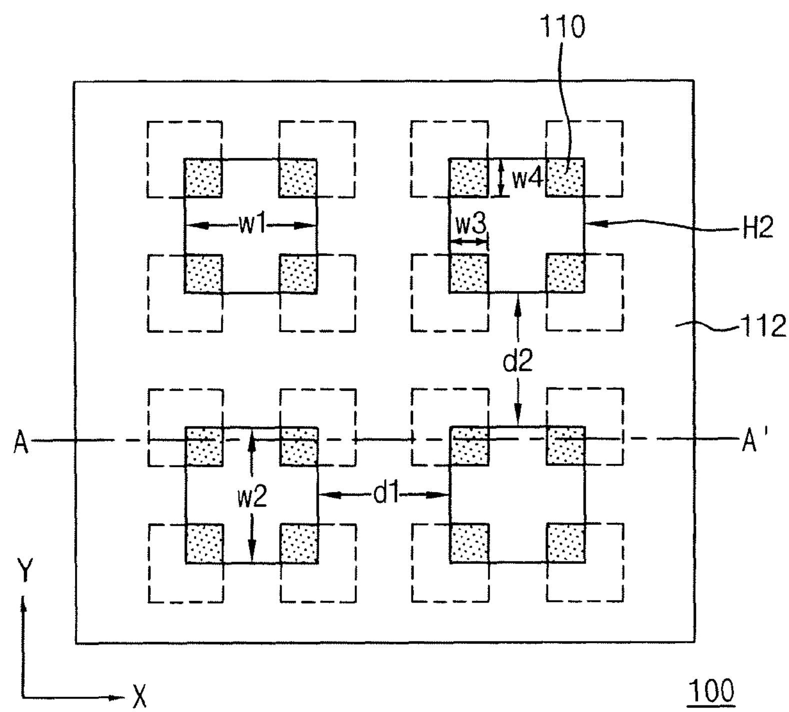
Figure 4B:
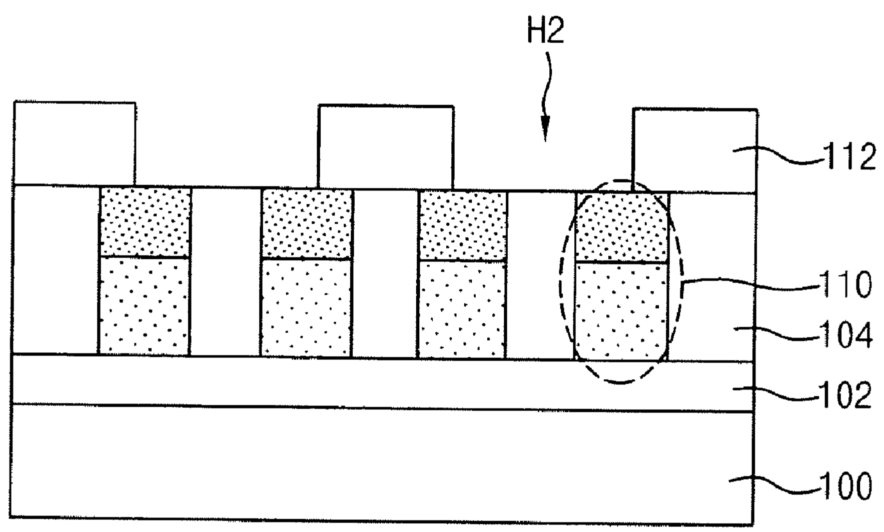

Referring to FIGS. 3B and 4B, a second insulation layer 112 is formed on the first insulation layer 104 having the plurality of vertical PN diodes 110. Then, by etching the second insulation layer 112, a plurality of second holes H2 is defined such that each second hole H2 exposes simultaneously portions of the vertical PN diodes 110 of four adjacent cells which face one another.

Preferably, the second holes H2 are defined to have a width we of 100~500 nm in the first direction X and a width w2 of 100~500 nm in the second direction Y. The second holes H2 can be defined in the shape of a rectangle such that they have different widths in the first direction X and the second direction Y. Also, the second holes H2 can be defined to have separation distances d1 and d2 of 100~500 nm in the first direction X and the second direction Y. Consequently, the vertical PN diodes 110 are exposed by the second holes H2 at a width w3 of 10~100 nm in the first direction X and at a width w4 of 10~100 nm in the second direction Y.

Since the second holes H2 are defined each to simultaneously expose partially the four adjacent cells facing one another, a lithographic process can be stably conducted when defining the second holes H2. Accordingly, in the present invention, in the respective cells, the contact area between the vertical PN diodes 110 and heaters to be subsequently formed can be made substantially uniform, and the resultant open areas of the upper ends of the heaters can also be made substantially uniform.

Figure 3C:
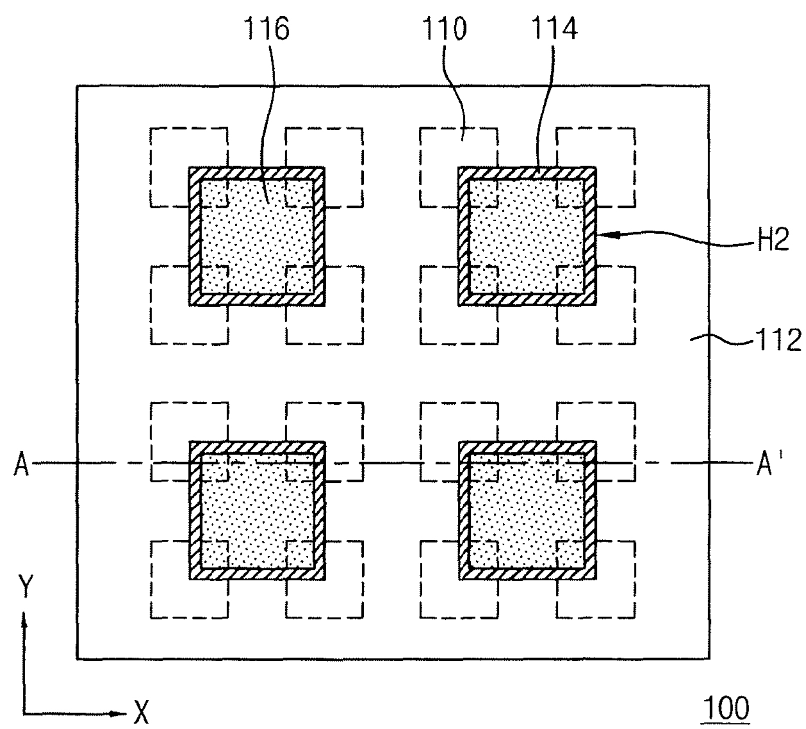
Figure 4C:
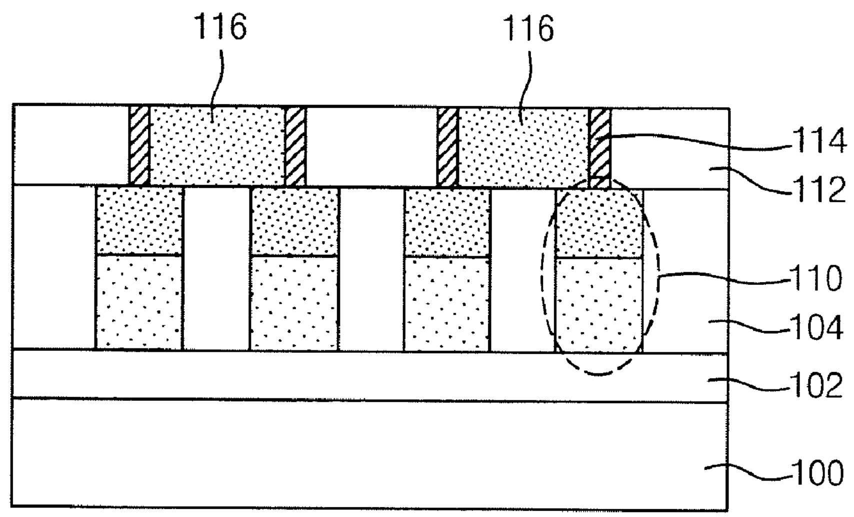

Referring to FIGS. 3C and 4C, after depositing a heater material layer 114 on the second insulation layer 112 having the second holes H2, the heater material layer 114 is then etched back in a manner in that it remains only on the sidewalls of the second holes H2. Then, after depositing a third insulation layer 116 to fill the second holes H2 which have the heater material layer 114 formed on the sidewalls thereof, the third insulation layer 116 is polished using the well-known CMP (chemical mechanical polishing) process until the second insulation layer 112 is exposed. Here, in the present invention, by changing the deposition thickness of the heater material layer 114, the contact area between the vertical PN diodes 110 and the heaters to be subsequently formed can be easily adjusted and controlled.

Figure 3D:
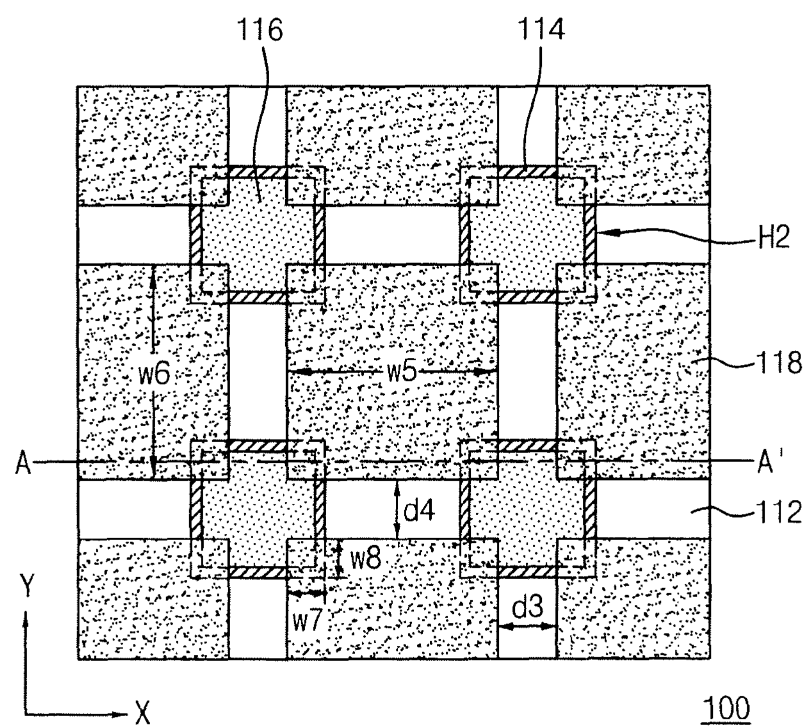
Figure 4D:
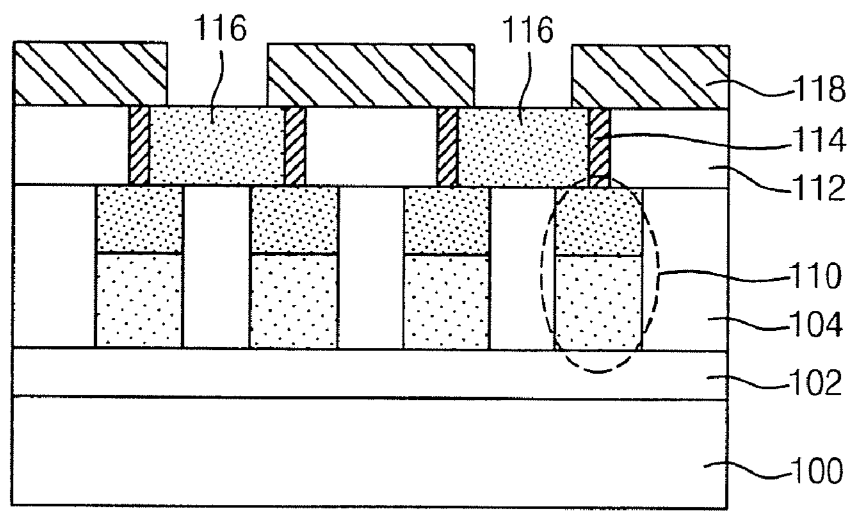

Referring to FIGS. 3D and 4D, a mask pattern 118 made of a hard mask material, for example, comprising a photoresist or a nitride layer, is formed on the second insulation layer 112, the heater material layer 114 and the third insulation layer 116. The mask pattern 118 is formed so that it covers the corner portions of the heater material layer 114 in their respective second holes H2. For example, the mask pattern 118 is formed to have widths w5 and w6 of 100~500 nm in the first direction X and the second direction Y and separation distances d3 and d4 of 10~100 nm in the first direction X and the second direction Y. Further, the mask pattern 118 is formed to have overlap widths w7 and w8 of 10~100 nm in the first direction X and the second direction Y with respect to the corner portions of the second holes H2 in which the heater material layer 114 and the third insulation layer 116 are formed. The overlap widths of the mask pattern 118 in the first direction X and the second direction Y may be differentiated from each other.

Figure 3E:
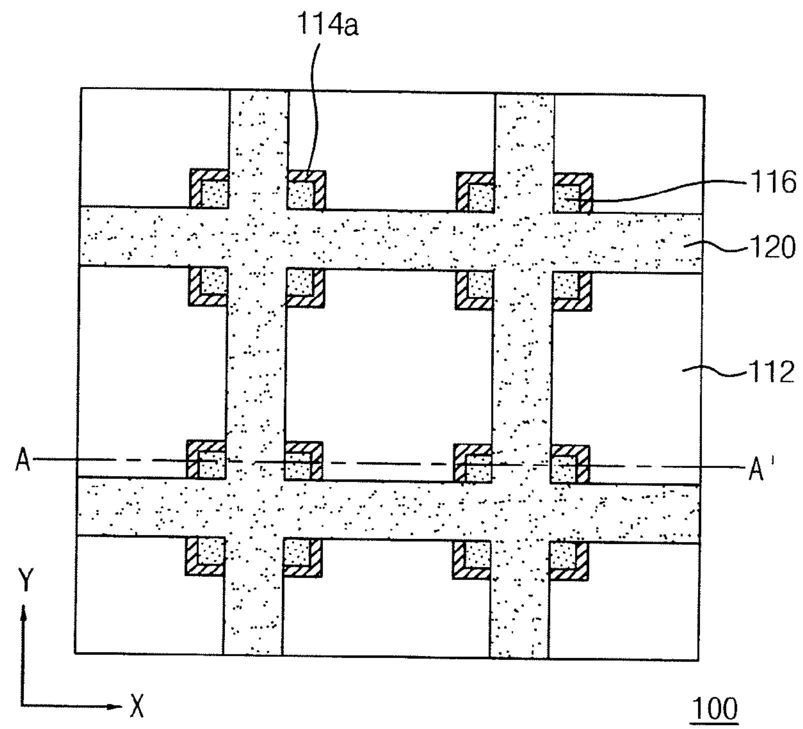
Figure 4E:
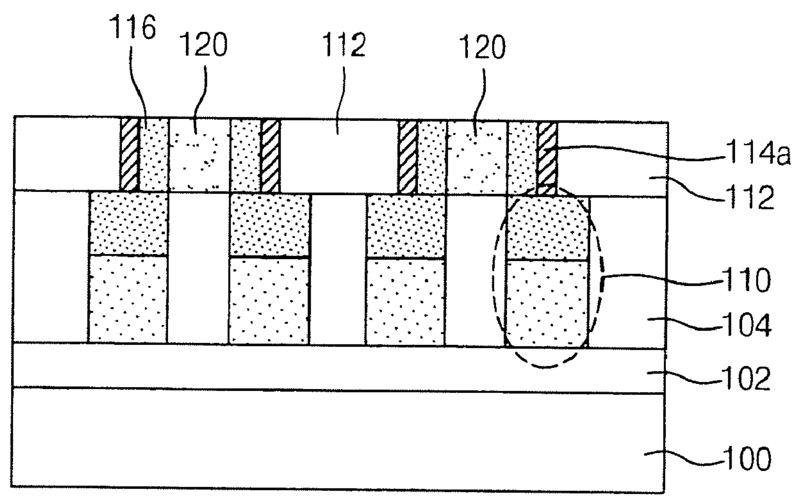

Referring to FIGS. 3E and 4E, portions of the heater material layer 114, the third insulation layer 116 and the second insulation layer 112, which are then exposed from the mask pattern 118, are subsequently etched. Accordingly, heaters 114*a* are formed having horizontal cross-sectional bent shapes that have a general shape of a boomerang which is bent at the middle portion thereof. Accordingly, four heaters 114*a* corresponding to four adjacent memory cells can constitute the respective four corners of a quadrangle which is formed by the adjacent four cells. Then, the mask pattern 118 can then be removed. Next, after depositing a fourth insulation layer 120 to fill the spaces which are formed by the removal of the portions of the heater material layer 114, the third insulation layer 116 and the second insulation layer 112, the fourth insulation layer 120 can be polished using a CMP process to expose the heaters 114*a*.

Figure 3F:
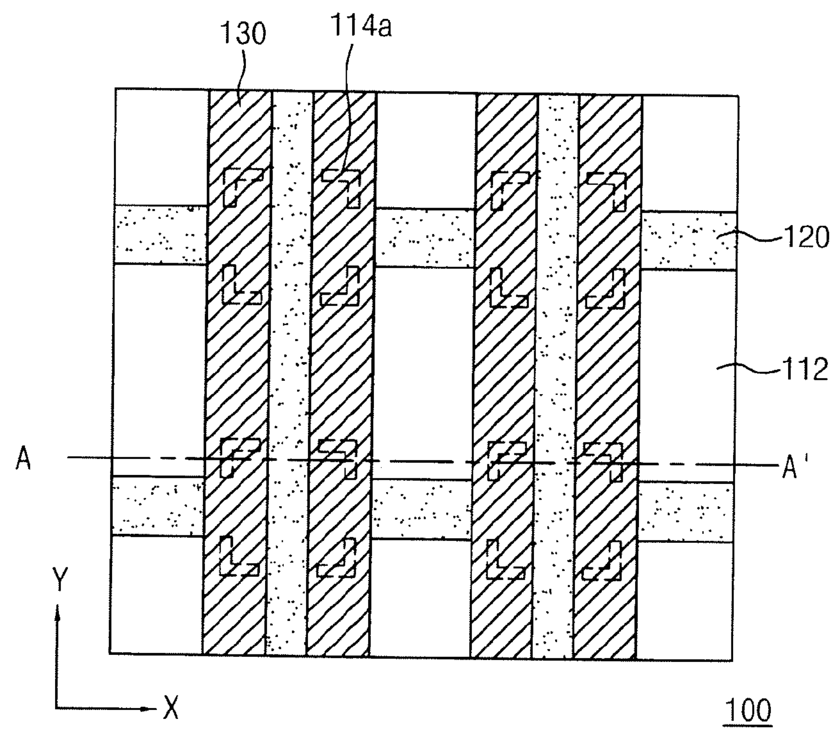
Figure 4F:
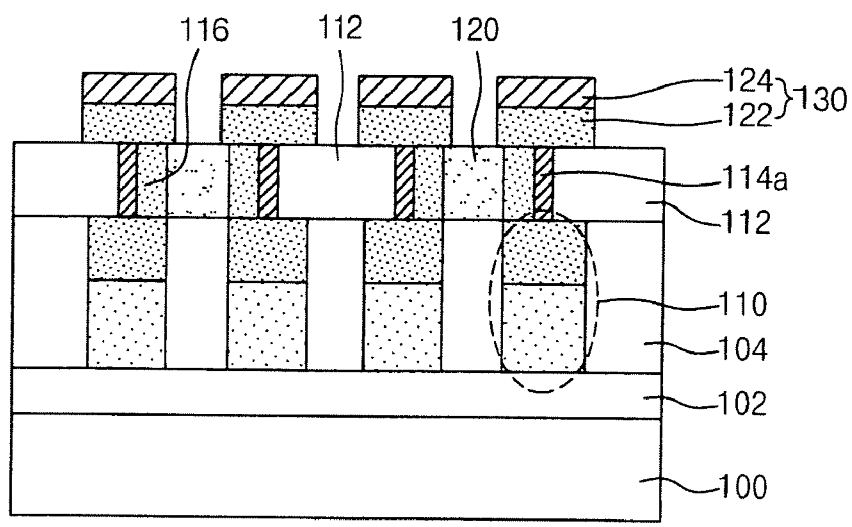

Referring to FIGS. 3F and 4F, after depositing a phase change material layer and a conductive layer for top electrodes on the heaters 114*a* and the second through fourth insulation layers 112, 116 and 120, can be patterned and subsequently etch to form a plurality of stack patterns 130. Each stack pattern 130 comprises a phase change layer 122 and top electrodes 124. In order to reduce the etch loss problems along the peripheries of the phase change layer 122, the stack patterns 130 of the phase change layer 122 and the top electrodes 124 are formed in the shape of a line that extends in the second direction Y and comes into contact with the heaters 114*a* arranged in the second direction Y.

Figure 3G:
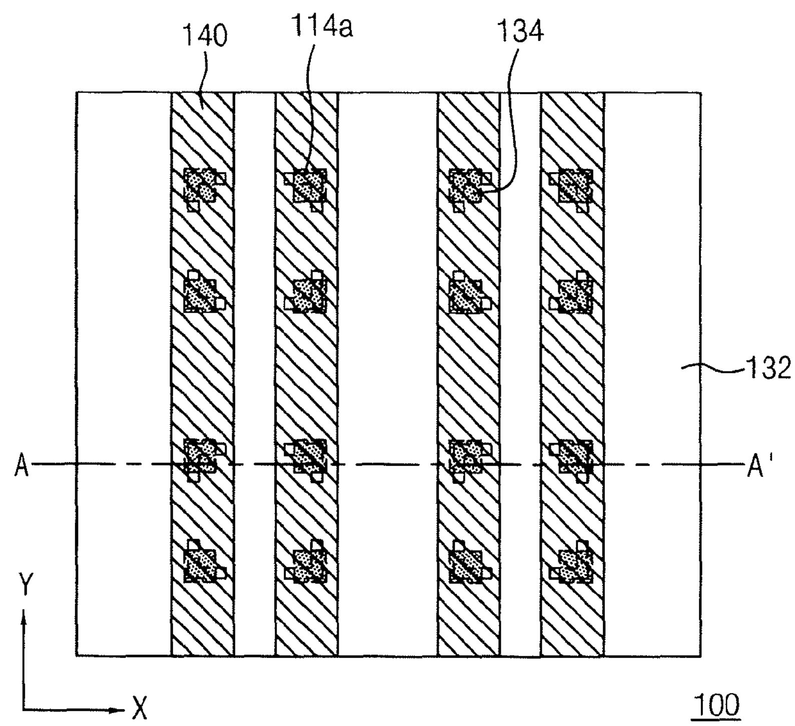
Figure 4G:
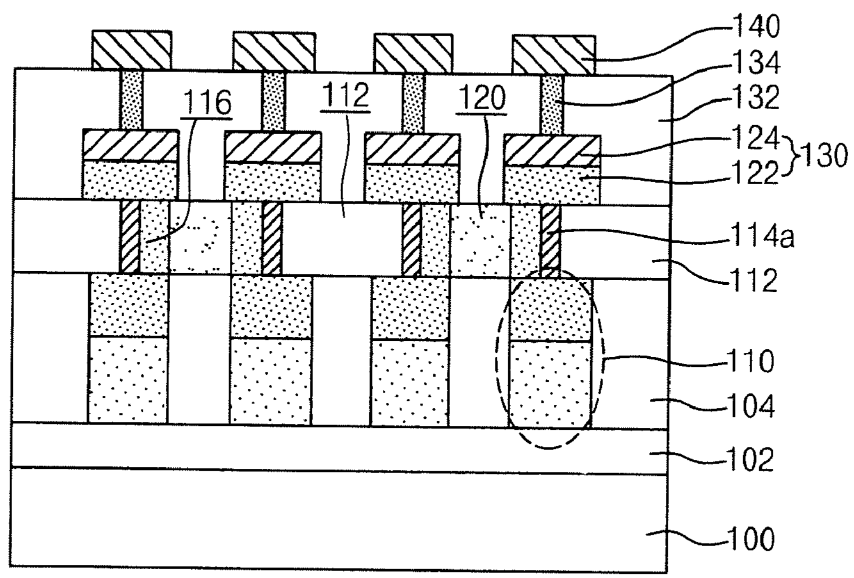

Referring to FIGS. 3G and 4G, a fifth insulation layer 132 is formed on the resultant silicon substrate 100 that is formed with the stack patterns 130 of the phase change layer 122 and the top electrodes 124 in the shape of a line. Then, after defining contact holes for exposing the top electrodes 124 of the stack patterns 130 in the respective cell areas by etching the fifth insulation layer 132, by filling a conductive layer in the contact holes, top electrode contacts 134 are formed. Next, after depositing a conductive layer made of a metallic material on the fifth insulation layer 132 having the top electrode contacts 134, by patterning the conductive layer, bit lines 140 are formed such that they substantially extend along the second direction Y in the same direction as the stack patterns 130. The bit lines 140 are formed to come into contact with the top electrode contacts 134 arranged in the second direction Y.

Figure 3H:
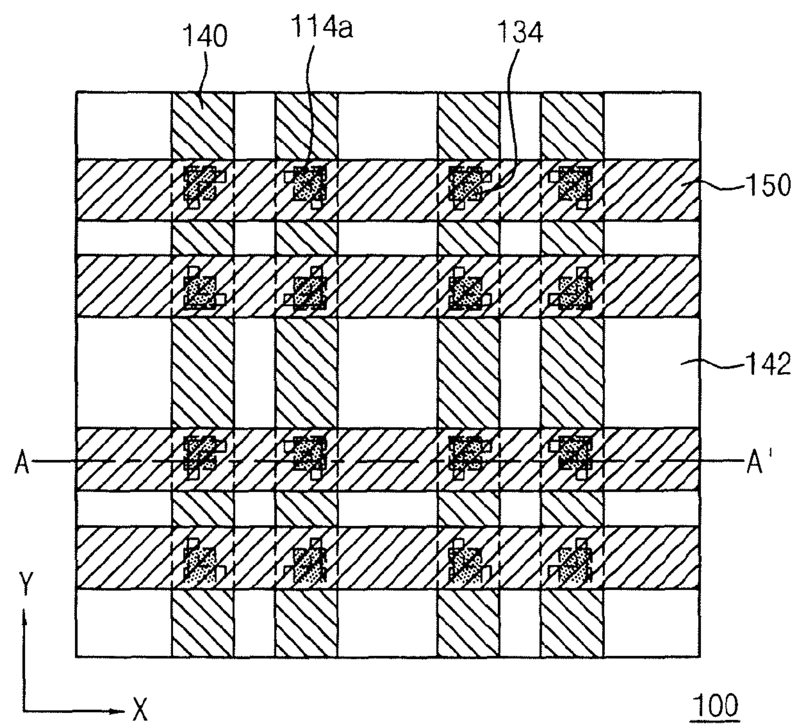
Figure 4H:
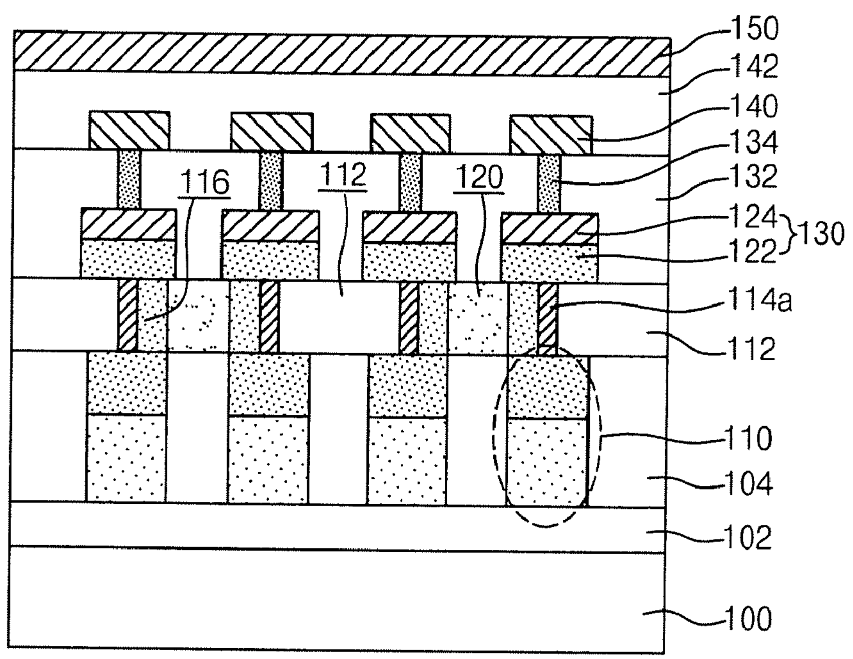
Figure 5A:
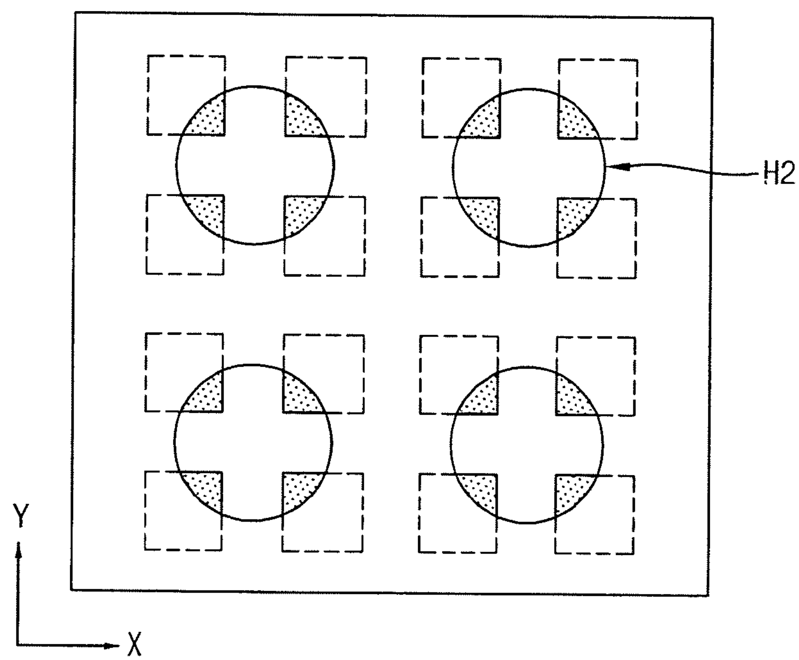
FIGS. 5A and 5B are plan views illustrating a method for manufacturing a phase change memory device in accordance with another embodiment of the present invention.
Figure 5B:
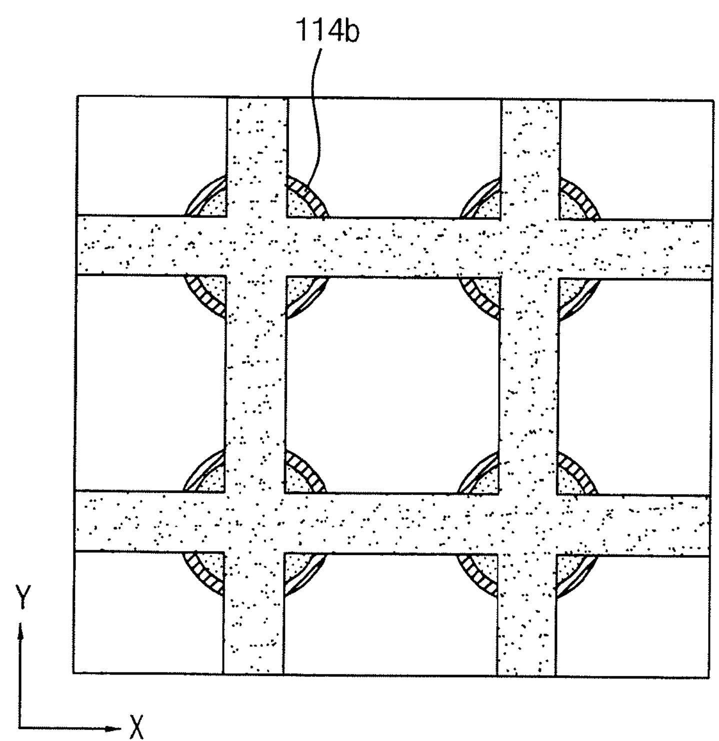
Figure 6A:
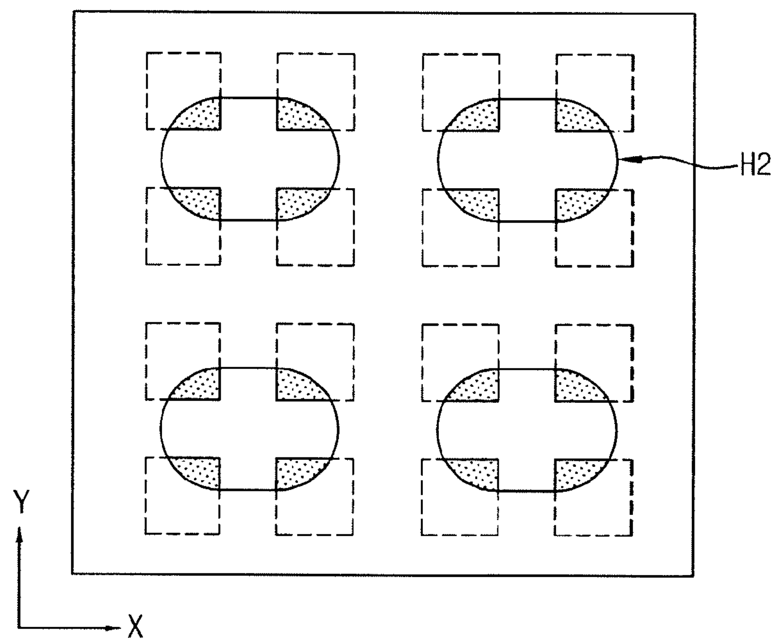
FIGS. 6A and 6B are plan views illustrating a method for manufacturing a phase change memory device in accordance with still another embodiment of the present invention.
Figure 6B:
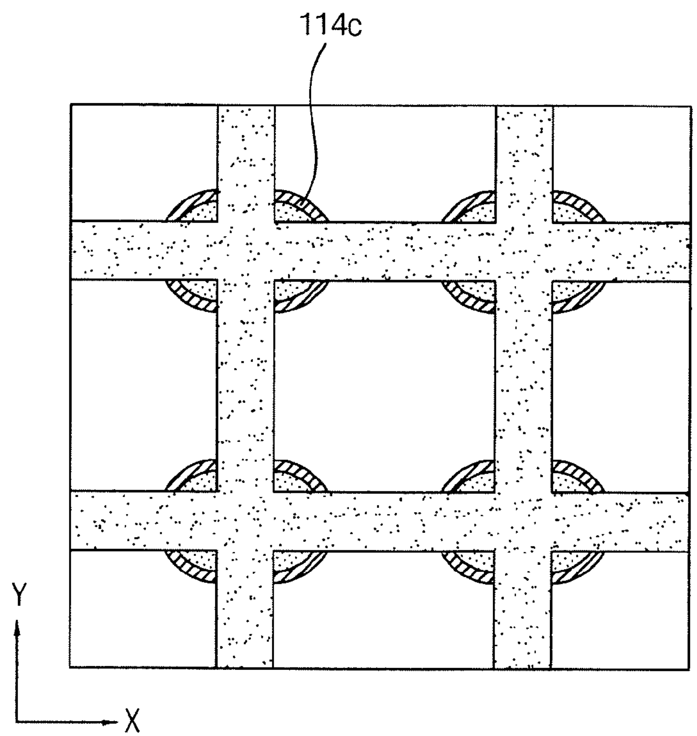

Referring to FIGS. 3H and 4H, a sixth insulation layer 142 is formed on the fifth insulation layer 132 having the bit lines 140. Then, word lines 150 are formed on the sixth insulation layer 142 in the first direction X perpendicular to the bit lines 140. Here, while not shown in the drawings, the word lines 150 are formed in a manner to be connected with the N+ base layer 120 via contact plugs formed using the sixth, fifth, second and first insulation layers 142, 132, 112 and 104.

Thereafter, by sequentially conducting a series of well-known subsequent processes, the manufacture of a phase change memory device according to the present embodiment is completed.

As is apparent from the above description, in the present invention, due to the fact that heaters are formed to have their horizontal cross-sectional bent shapes approximating the shape of a boomerang, the contact area between the heaters and a phase change layer can be reduced when compared to the conventional art. Specifically, in the present invention, by forming the heaters, having the horizontal cross-sectional bent shape as that of a boomerang, then adjacent four cells that face one another can have their heaters uniformly formed, and by changing the deposition thickness of the heater material layer, the contact area of the heaters with the phase change layer can be easily adjusted or controlled.

As a consequence, in the present invention, since not only can the heaters be uniformly formed and the contact area between the heaters and the phase change layer can be substantially reduced, then the programming current can be substantially decreased. Accordingly, the distribution of the programming current can be subsequently narrowed when using the present invention. Thereby it is possible to realize a phase change memory device that exhibits improved reliability and increased operation speed.

Meanwhile, in the aforementioned embodiment of the present invention, when forming the heaters that have horizontal cross-sectional bent shapes such as those of a boomerang, then second holes can be used to defined the shape of a quadrangle that exposes four adjacent cells facing one another, in which the heaters can have the horizontal cross-sectional bent shapes of those of a boomerang which is bent at a right angle at the middle portion thereof. In this regard, if the second holes are defined in the shape of a circle or an ellipse as shown in FIGS. 5A and 5B or 6A and 6B, heaters 114*b* and 114*c* can have horizontal cross-sectional bent shapes of those of a boomerang which is rounded at the middle portion thereof.

Even in this case, by changing the deposition thickness of a heater material layer, the contact area between the heaters and a phase change layer can be reduced.

Figure 7A:
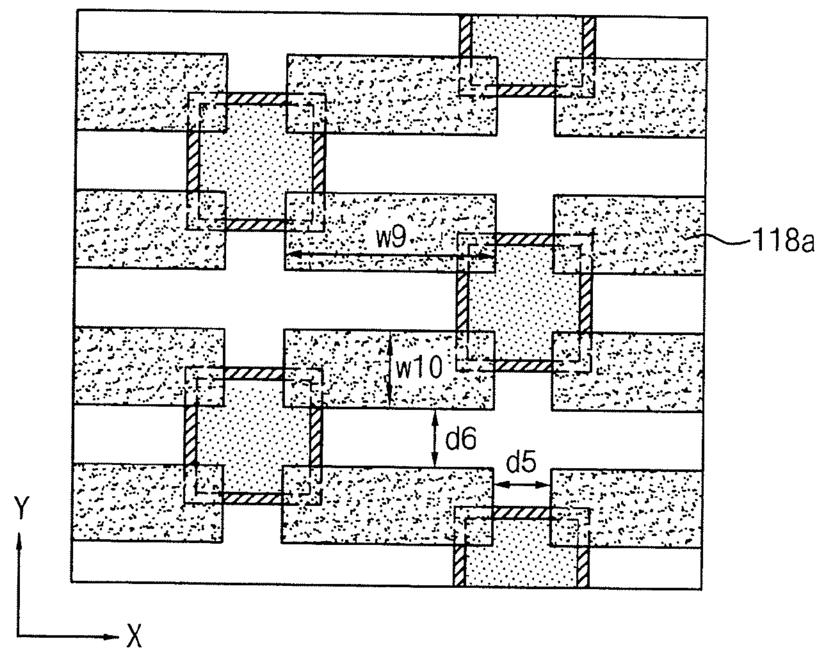
FIGS. 7A and 7B are plan views illustrating a method for manufacturing a phase change memory device in accordance with a still further embodiment of the present invention.
Figure 7B:
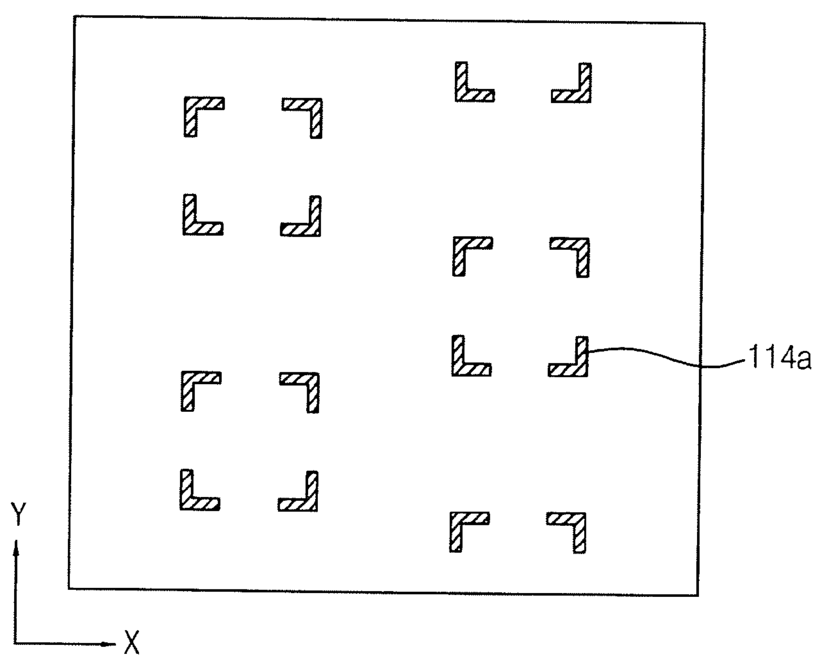

FIGS. 7A and 7B are plan views illustrating a method for manufacturing a phase change memory device in accordance with another embodiment of the present invention.

In this embodiment, heaters 114*a*, which are provided in the unit of four cells and have the sectional shape of a boomerang, are formed such that they are arranged in a zigzag pattern. This is unlike the aforementioned embodiment in which the heaters provided in the unit of four cells were arranged in the form of a matrix pattern. For this purpose, a mask pattern 118*a* for partially covering a heater material layer 114 is formed such that it has a width w9 of 100~500 nm in a first direction X, a width w10 of 50~200 nm in a second direction Y, and separation distances d5 and d6 of 50~200 nm in the first direction X and the second direction Y.

Even in this embodiment, by defining second holes in the shape of a circle or an ellipse in which the heater material layer is to be deposited, heaters can have their respective horizontal cross-sectional bent shapes resembling those of a boomerang having rounded middle portions thereof.

The remaining portions of the method according to the present embodiment are the same as those of the aforementioned embodiment, and therefore, the illustration and description thereof will be omitted herein.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A phase change memory device comprising heaters that are formed in respective memory cells and stack patterns of a phase change layer and top electrodes that are formed to come into contact with the heaters in the respective memory cells, wherein each phase change layer is arranged in a vertical direction and has the shape of a line, wherein each heater has a horizontal cross-sectional bent shape of similar to that of a boomerang.

2. The phase change memory device according to claim 1, wherein the horizontal cross-sectional bent shape of each of the heaters has a boomerang shape at a middle portion of each heater.

3. The phase change memory device according to claim 1, wherein the horizontal cross-sectional bent shape of each heater has a boomerang rounded shape at a middle portion of each heater.

4. The phase change memory device according to claim 1, wherein each memory cell of the device comprising one cell switching element; one heater; one phase change layer; one top electrode; and one top electrode contact.

5. The phase change memory device according to claim 4, wherein heaters of four adjacent memory cells forming a quadrangle shape.

6. The phase change memory device according to claim 4, wherein the heaters of four adjacent memory cells forming a zigzag pattern along the first direction.

7. A phase change memory device comprising:

a silicon substrate having a plurality of active regions that extend along a first direction of the silicon substrate and that the active regions are arranged at substantially regular intervals along a second direction on the silicon substrate such that the second direction is substantially perpendicular to the first direction;

a plurality of cell switching elements being formed on top of the active regions;

a plurality of heaters being formed on top of the cell switching elements wherein each heater has a horizontal cross-sectional bent shape;

a plurality of stack patterns, each stack pattern comprising a phase change layer and top electrode being formed on top of a respective heater;

a plurality of top electrode contacts, each electrode contact being formed on top of a respective top electrode of the stack pattern;

a plurality of bit lines being formed on top of and connected to the top electrode contacts, wherein the bit lines are substantially arranged along the second direction; and a plurality of word lines being horizontally formed along the first direction on top of the top electrode contacts wherein the second direction is substantially perpendicular to the first direction, wherein each memory cell comprises one cell switching element; one heater; one stack pattern; and one top electrode contact.

8. The phase change memory device according to claim 7, wherein each active region comprises an N+ base layer formed on the substrate.

9. The phase change memory device according to claim 7, wherein each cell switching element comprises a vertical PN diode.

10. The phase change memory device according to claim 7, wherein a middle portion of the horizontal cross-sectional bent shape of each heater has a substantial boomerang shape.

11. The phase change memory device according to claim 7, wherein the middle portion of the horizontal cross-sectional bent shape of each heater is rounded thereof.

12. The phase change memory device according to claim 7, wherein heaters of four adjacent memory cells constitute four corners of a quadrangle.

13. The phase change memory device according to claim 12, wherein heaters of four adjacent memory cells touch each other to form a rectangular matrix shape pattern.

14. The phase change memory device according to claim 12, wherein heaters of four adjacent memory cells form a zigzag pattern substantially along the first direction.

* * * * *